United States Patent
Roessler

(10) Patent No.: US 7,196,515 B2
(45) Date of Patent: Mar. 27, 2007

(54) HALL SWITCH ARRANGEMENT

(75) Inventor: Werner Roessler, Neufahrn (DE)

(73) Assignee: Infineon Technologies AG, Munich (DE)

( * ) Notice: Subject to any disclaimer, the term of this patent is extended or adjusted under 35 U.S.C. 154(b) by 148 days.

(21) Appl. No.: 11/132,940

(22) Filed: May 19, 2005

(65) Prior Publication Data

US 2005/0270021 A1    Dec. 8, 2005

(30) Foreign Application Priority Data

May 19, 2004  (DE) .................. 10 2004 024 910

(51) Int. Cl.
*G01R 33/07* (2006.01)
(52) U.S. Cl. ..................... 324/251; 324/207.2
(58) Field of Classification Search ............. 324/251, 324/207.2
See application file for complete search history.

(56) References Cited

U.S. PATENT DOCUMENTS

| | | | | |
|---|---|---|---|---|
| 4,349,814 A | * | 9/1982 | Akehurst | 340/679 |
| 4,622,496 A | * | 11/1986 | Dattilo et al. | 315/283 |
| 5,084,674 A | | 1/1992 | Lachmann et al. | 324/174 |
| 5,578,977 A | * | 11/1996 | Jansseune | 335/207 |

FOREIGN PATENT DOCUMENTS

DE      4135381 A1    4/1993

\* cited by examiner

*Primary Examiner*—Bot LeDynh
(74) *Attorney, Agent, or Firm*—Baker Botts L.L.P.

(57) ABSTRACT

The Hall switch arrangement comprises a plurality of Hall switch elements connected in series with a first Hall switch element, wherein the first Hall switch element is formed to provide a first output signal, which has information about a switching state of the first Hall switch element and with a second Hall switch element, wherein the second Hall switch element is formed to receive the first output signal of the first Hall switch element and to provide a further output signal having information about the switching state of the first Hall switch element and further information about the switching state of the second Hall switch element.

20 Claims, 3 Drawing Sheets

HALL SWITCH ARRANGEMENT

CROSS-REFERENCE TO RELATED APPLICATION

This application claims priority from German Patent Application No. 10 2004 024910.5, which was filed on May 19, 2004, and is incorporated herein by reference in its entirety.

TECHNICAL FIELD

The present invention generally relates to a Hall switch arrangement of a plurality of Hall switch arrangement elements and particularly to a Hall switch arrangement of a plurality of Hall switch arrangement elements connected in series having a magnetic switching behavior.

BACKGROUND

Hall sensor systems using Hall switch arrangements are frequently used in the art for detecting positions, angular positions and distances of objects with regard to a Hall sensor element. Therefore, for example, a control magnet is brought close to a Hall sensor, so that a varying measurement voltage, e.g. Hall voltage, is generated at the same due to the varying magnetic field, which results due to the altered position and the altered distance, respectively. With the help of a downstream threshold evaluation circuit, e.g. a comparator circuit or a comparator circuit with hysteresis (Schmitt trigger circuit) the change of position can be detected in a digital way via control magnets. Thus, Hall sensors are used as so called Hall switch arrangement for position and distance detection, respectively, of_ movable parts. Hall sensor elements and Hall switches, respectively, are thus used particularly for the usage as position and proximity switches in industrial applications and particularly in the field of automobiles, wherein these Hall sensors can, for example, be used in a vehicle for detecting gear shift positions, the seat position, mirror positions, in the belt lock, in window regulators, in the sliding roof or other applications.

In the following, with regard to the Hall switch element 10 illustrated merely schematically in FIG. 4, its general mode of operation will be discussed below. As is illustrated in FIG. 4, the Hall switch element 10 has a first input terminal 10a for providing a supply voltage $V_{CC}$, a second input terminal 10b for providing a reference potential GND, e.g. ground potential, and an output terminal 10c for providing an output signal OUT. Further, the Hall switch element 10 comprises a Hall sensor element 12, a control and supply means 14 and an evaluation and processing means 16. As illustrated in FIG. 4, the control and supply means 14 is provided to control the Hall sensor element 12 with an appropriate control signal and to further supply the evaluation and processing means 16, for example, with energy. The evaluation and processing means 16 is, for example, provided to evaluate the output signal, e.g. the Hall voltage, of the Hall sensor element 12, wherein the evaluation and processing means 16 is, for example, formed as a comparator means or a comparator means with hysteresis (Schmitt trigger) to output the output signal OUT to the output terminal 10c, which represents a switching state of the Hall switch element 10.

In the following, it will be explained with regard to FIGS. 5a–c, how a typical switching signal OUT of a Hall switch element is obtained. As illustrated in FIG. 5a, the Hall switch element 10 is, for example, subject to a magnetic flow density B with varying amplitude, wherein this represents, for example, the approximation or removal of a control magnet or generally any change of a magnetic field and a magnetic flux density, respectively, which penetrates the Hall switch element 10, and is based on a change of position of an object to be monitored. Then, in the Hall sensor element 12 of the Hall switch element 10, the magnetic flux density is converted into an output voltage proportional thereto, e.g. a Hall voltage.

If, for example, the evaluation and processing means is formed as simple comparator means with a switching threshold $S_0$, the curve of the output signal illustrated in FIG. 5b results, wherein a change of the output voltage of the output signal is caused, for example between a first logic level "L" and a second logic level "H", when the switching threshold $S_0$ crosses the magnetic flux density and the resulting Hall voltage, respectively. A comparison of the magnetic flux density with the switching threshold $S_0$ means that the output signal, i.e. the Hall voltage, of the Hall sensor element 12 is compared to a reference voltage as switching threshold.

In FIG. 2c, an output signal OUT is illustrated, which is obtained by a comparator means with hysteresis, wherein an upper threshold $S_1$ and a lower threshold $S_2$ are provided, wherein the output signal OUT when crossing the upper threshold $S_1$ transits from the first logic level to the second logic level, and wherein the output signal OUT only transits back from the second logic level to the first logic level when the second lower switching threshold $S_2$ is undershot. The first and second switching thresholds $S_1$, $S_2$ are, for example, disposed symmetrically around the basic switching threshold $S_0$.

Through the hysteresis, it is achieved that for evaluation signals, which are fluctuating around the area of the switching threshold $S_0$, no constantly changing output signal OUT is generated with every crossing of the switching threshold.

The output terminal 10c of the Hall switch element 10 is now generally connected to a microprocessor means (not shown in FIG. 4), which evaluates the switching signal OUT of the Hall switch element 10. As has already been mentioned above, such Hall switch elements 10 are, for example, used extensively in automobile engineering as position and proximity switches, respectively, wherein therefore, a plurality of switches are grouped relatively close in space to each other, for example for determining the gear shift position according to the number and resolution, respectively, of the positions to be detected. However, these Hall switch elements 10 are disposed relatively far apart from the microprocessor means, e.g. the board computer of a vehicle, which evaluates the switching state.

According to the prior art, an individual signal line is installed from every Hall switch element 10 to an individual microprocessor input. This provision of a plurality of lines to the microprocessor means represents an increased processing effort and thus increased processing costs. Further, it is required that the microprocessor means has sufficient input terminals for receiving every output signal OUT of every Hall switch element 10. If a large number of input terminals of a microprocessor means has to be provided, as a consequence, on the one hand, a relatively complex switching layout of the microprocessor means with a large number of input terminals will be required, and, on the other hand, the dimensions of the microprocessor means will have to be kept relatively large due to the large number of pins, since the size of a semiconductor chip is substantially influenced by the number of required pins.

SUMMARY

It is an object of the present invention to provide an arrangement of a plurality of Hall switch elements, wherein the switching effort for providing the output signals of the plurality of Hall switch elements to a microprocessor means can be reduced.

The present invention provides a hall switch arrangement with a plurality of Hall switch elements connected in series, having: a first Hall switch element, wherein the first Hall switch element is formed to provide a first output signal having information about a switching state of the first Hall switch element, and a second Hall switch element, wherein the second Hall switch element is formed to receive the first output signal of the first Hall switch element and to provide a further output signal having information about the switching state of the first Hall switch element and further information about a switching state of the second Hall switch element.

The present invention is based on the knowledge that a plurality of preferably similar Hall switch elements is disposed in a concatenated way, i.e. connected in series and cascaded, respectively, wherein at least the second Hall switch element and the optionally subsequent Hall switch elements, respectively, have an additional input. In this chain, one input terminal of a subsequent Hall switch element can be connected to the output terminal of a previous Hall switch element, wherein the output terminal of the last Hall switch element in the chain is connected to a single microprocessor input.

Thus, according to the present invention, preferably, similar Hall switch elements are concatenated, wherein the input signal, which is transmitted from one Hall switch element to the subsequent Hall switch element is latched in this subsequent Hall switch element. The own status information, i.e. information, for example, about the switching state of the Hall switch element are now attached and inserted, respectively, to the latched input signal, wherein the present signal, e.g. the resulting data word with information about the switching states of the previous Hall switch elements in the chain is transferred to the next Hall switch element, until the last Hall switch element of the chain provides the output signal containing all information about the switching states of all Hall switch elements in the chain to the microprocessor means.

In summary, this means that every Hall switch element attaches and inserts, respectively, its information about the respective switching state to the latched data signal, information signal and data word, respectively, and transfers the resulting data word to the respectively subsequent Hall switch element. Thus, the cascading of the Hall switch elements leads to an accumulation of switching state information in the respective output signal of the Hall switch elements disposed in a series circuit.

According to the present invention, the first switch in the chain is, for example, designed as a special version without input pin, or the input pin of the first Hall switch element is occupied by a reference potential, e.g. ground potential, which turns the first Hall switch element into a start component. Thus, the first Hall switch element can be identified as start component by a predefined external wiring or by a specifically configured switching design.

The power-up behavior of the Hall switch arrangement is, for example, such that the output terminals of the Hall switch element first have a second logic state (e.g. a high logic level) for a predetermined time period, so that the start component, whose input terminal is connected, for example, to a reference potential, realizes its special position. In order to transfer a data word, i.e. a signal with the respective switching state information, from Hall switch element to Hall switch element, a suitable data log is used. Therefore, in the idle state, the data line between the input and output terminals of the Hall switch elements connected in series is on a first logic level, e.g. a low logic level. In cyclic intervals, the start component starts the data log with a start pulse, which is, for example, twice as long, i.e. two impulses with the second logic state, e.g. a high logic state. The status information related to the switching state of the respective Hall switch element are now attached to this start pulse, for example in a bi-phase coding, wherein every bit of the source data is replaced by two bits with different logic state. Thereby, the information content of the source data bit is defined by the two different bits of the bi-phase coding due to the transition from a logic low state to a high logic state and from a high logic state to a low logic state, respectively, between the two bits of the bi-phase coding, so that the direction of the signal change of the two bits of the bi-phase coding marks the state of the source bit. A logic low state with double length on the data line can, for example, signalize the end of the log and the end of the data word, respectively.

The maximum number of Hall switch elements to be connected in series is only determined by the repetition rate of the data output and the size of the internal latch of the Hall switch elements.

Thus, according to the invention, it is made possible that only one line and one microprocessor input are required each for transferring switching state information of the Hall switch elements connected in series to the microprocessor means, by realizing an accumulation of the switching state information by cascading Hall switch elements. Thereby, the structure, i.e. the wiring effort for providing a plurality of Hall switch elements connected in series can be reduced significantly, wherein further only a single input of the microprocessor means is required for a certain number of Hall switch elements.

Thus, for example functionally related Hall switch elements, which are, for example, provided for seat position adjustment in a vehicle, can be combined functionally in one cascade, wherein, for example, those Hall switch elements, which are used for gear shift position determination, can again be functionally combined in one cascade, etc., so that the number of required signal lines to be installed to the microprocessor means, which evaluates the individual switching states, can be reduced significantly. Further, the assembly of the microprocessor means can be reduced significantly with regard to the required number of pins, which can reduce the effort for circuit development and production of respective microprocessor means significantly.

BRIEF DESCRIPTION OF THE DRAWINGS

These and other objects and features of the present invention will become clear from the following description taken in conjunction with the accompanying drawings, in which.

DETAILED DESCRIPTION

Figure 1:
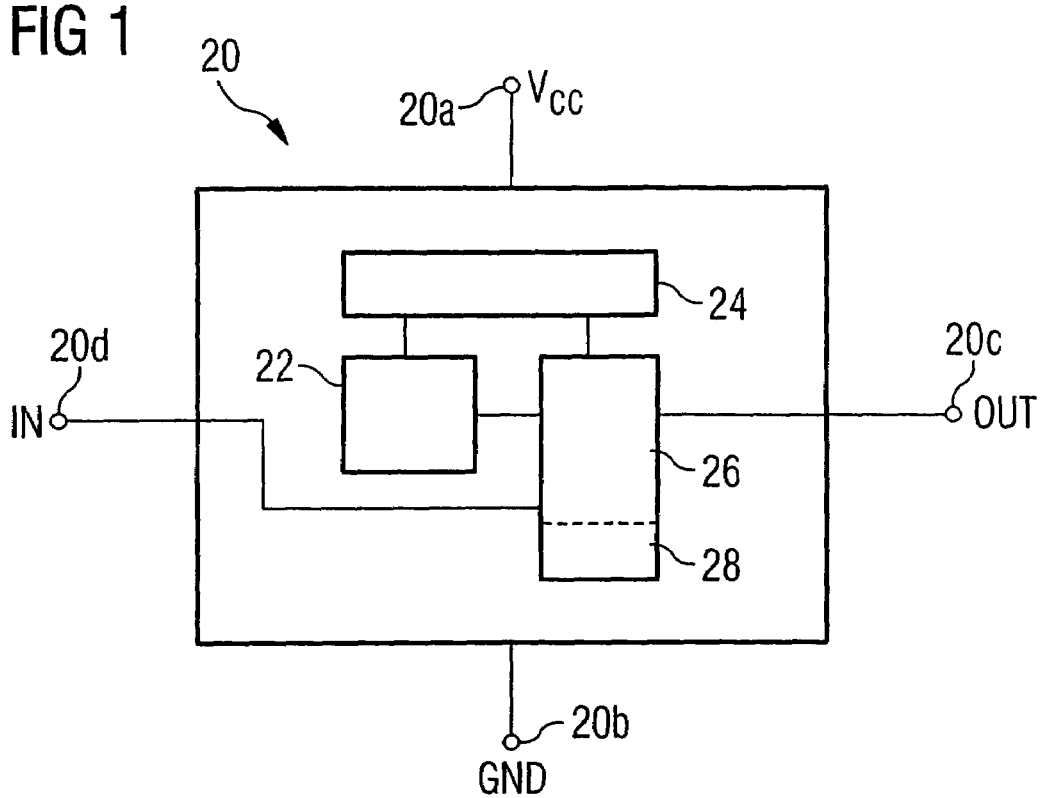
FIG. 1 is a Hall switch element according to the present invention.
Figure 4:
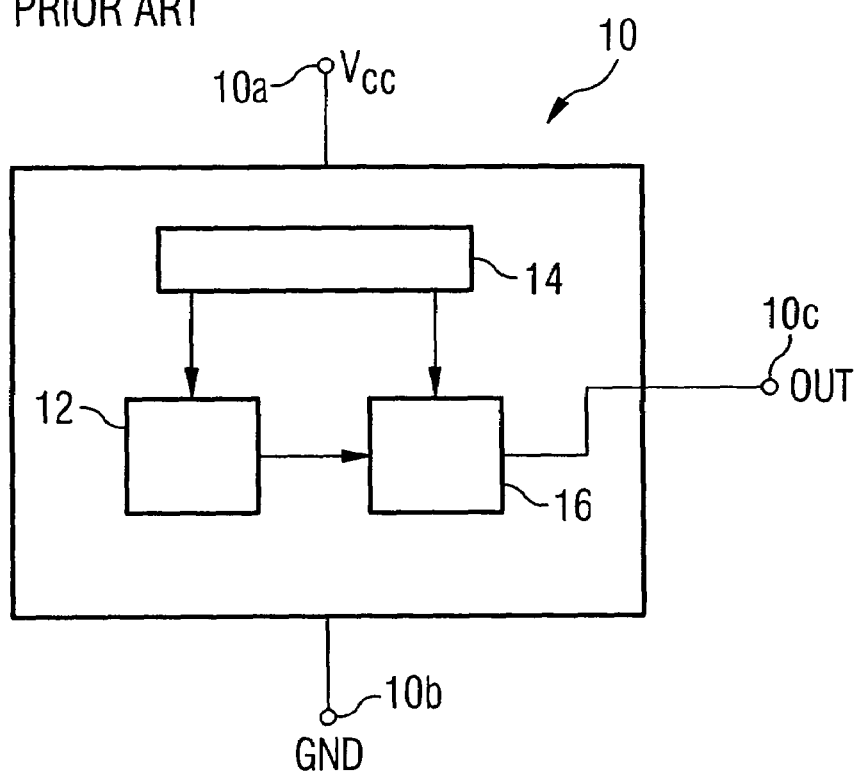
FIG. 4 is a basic representation of a known Hall switch element according to the prior art.
Figure 2:
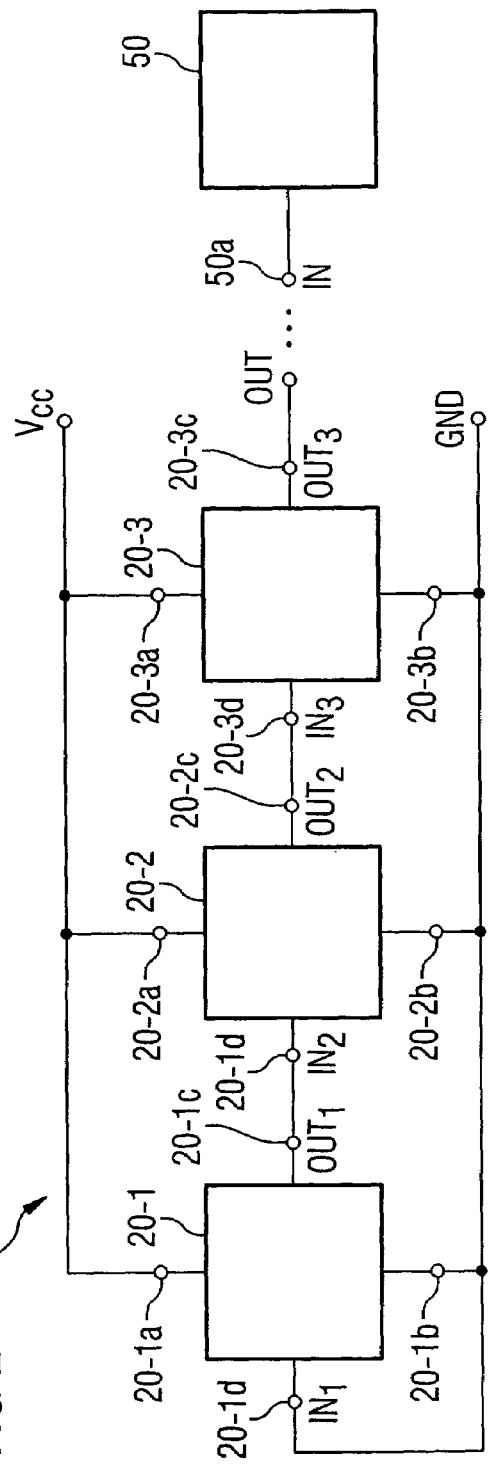
FIG. 2 is a basic representation of a Hall switch arrangement of a plurality of Hall switch elements according to the present invention.
Figure 3:
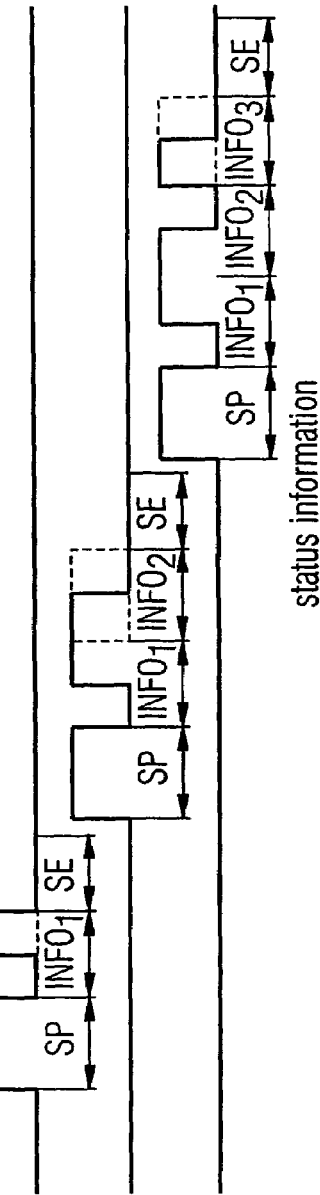
FIG. 3 is the respective output signals of the individual Hall switch elements and the data log, respectively, of the inventive Hall switch arrangement.
Figure 5A:
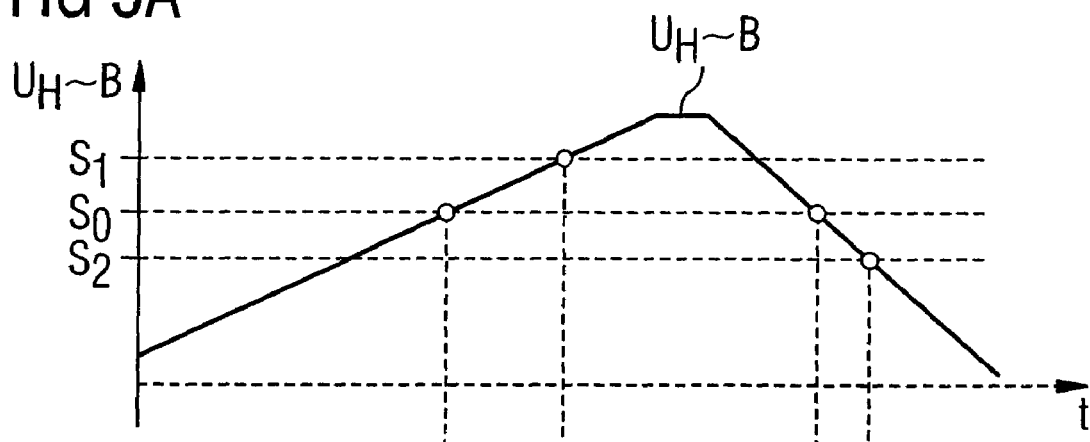
FIGS. 5a–c is the output signal and the switching state, respectively, of a known Hall switch element according to the prior art.
Figure 5B:
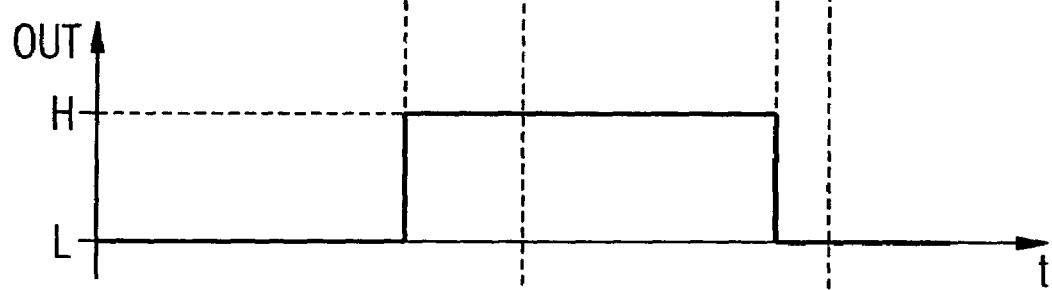
Figure 5C:
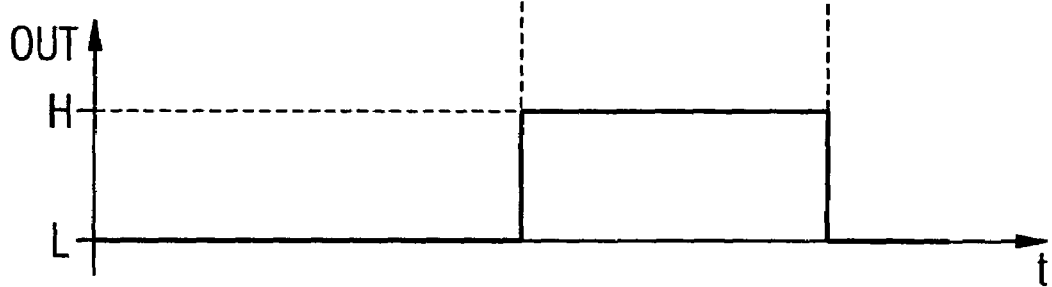

With reference to FIGS. 1–3, a preferred embodiment of the present invention will be discussed in detail with regard to a Hall switch arrangement 100 with a plurality of Hall switch elements 20-1, 20-2, 20-3 connected in series.

As is illustrated in FIG. 1, a Hall switch element 20 has a first input terminal 20a for receiving a first reference potential, e.g. a positive supply voltage $V_{CC}$, a second input terminal for receiving a second reference potential, e.g. ground potential GND, a third terminal 20c for providing an output signal OUT and a fourth terminal 20d for receiving an input signal IN. Further, the Hall switch means 20 has a Hall switch element 22, a control and supply means 24 and an evaluation and processing means 26. The terminals 20a, 20b, 20c and the components 22, 24, 26 correspond substantially to the components 10a–c, 12, 14 and 16 illustrated with regard to the Hall switch element 10 illustrated in FIG. 1, and have substantially the same mode of operation, so that a renewed description of these elements and their mode of operation is omitted.

As is illustrated in FIG. 1, the Hall switch element 20 has only one additional input terminal 20d compared to the Hall switch element 10, wherein the evaluation and processing means 26 of the Hall switch element 10 has an additional memory element 28.

In the following, with reference to FIG. 2, the mode of operation of the inventive Hall switch arrangement 100 with a plurality of Hall switch elements 20-1, 20-2, 20-3 connected in series and a microprocessor means 50 with an input terminal 50a will be explained in detail.

As is illustrated in FIG. 2, the inventive Hall switch arrangement 100 has a first Hall switch element 20-1, a second Hall switch element 20-2 and a third Hall switch element 20-3, which are preferably formed equal with regard to their function, and substantially correspond to the Hall switch element 20 with regard to structure and mode of operation. Further, a microprocessor means 50 with an input terminal 50a for receiving an input signal IN is illustrated in FIG. 2. With regard to the Hall switch arrangement illustrated in FIG. 2, it should be noted that the number of three Hall switch elements 20-1, 20-2, 20-3 has been chosen merely exemplarily to represent the inventive principle of a series circuit and cascading, respectively, of a plurality of Hall switch elements, wherein it should become obvious with regard to the present invention that the inventive principle can be chosen freely starting from two Hall switch elements up to a substantially arbitrary number of Hall switch elements connected in series depending on the case of application.

As illustrated in FIG. 2, the first Hall switch element 20-1 of the Hall switch arrangement 100 has a first input terminal 20-1a for receiving the first reference potential $V_{CC}$, e.g. the supply voltage, a second input terminal 20-1b for receiving a second reference potential GND, e.g. ground potential, an output terminal 20-1c for providing an output signal $OUT_1$ and an input terminal 20-1d for receiving an input signal $IN_1$. As illustrated in FIG. 2, the input terminal 20-1d of the first Hall switch element 20-1 is connected to the second reference potential GND, wherein this wiring of the Hall switch element 20-1 is optional, as will be explained in more detail below.

As is further illustrated in FIG. 2, the second Hall switch element 20-2 has the respective terminals 20-2a–20-2d, wherein the input terminal 20-2d of the second Hall switch element 20-2 is connected to the output terminal 20-1c of the first Hall switch element 20-1. The third Hall switch element 20-3 has again the four terminals 20-3a–20-3d, wherein the input terminal 20-3d of the third Hall switch element 20-3 is connected to the output terminal 20-2c of the second Hall switch element 20-2, and wherein the output terminal 20-3c of the third Hall switch element 20-3 is either connected to an input terminal of an optionally subsequent Hall switch element (not shown in FIG. 2), or to the input terminal 50a of the microprocessor means 50 when the third Hall switch element 20-3 is the last of the cascade (chain) of Hall switch elements.

In the following, the mode of operation of the Hall switch arrangement 100 illustrated in FIG. 2 will be explained with reference to FIG. 3, which illustrates exemplarily the output signals $OUT_1$, $OUT_2$, $OUT_3$ of the individual Hall switch arrangement 20-1, 20-2, 20-3 of FIG. 2.

As has already been explained above with regard to the prior art, in dependence on the magnetic field component penetrating the respective Hall switch element, every Hall switch element preferably outputs an output signal and a switching state, respectively, which indicates, for example, a rotation and motion direction and/or rotation and motion speed, respectively, relative to an object to be "monitored" (not shown in FIG. 2) and/or a distance between the Hall switch element and the object to be monitored. According to the present invention, as illustrated basically in FIG. 2 with regard to the Hall switch arrangement 100, preferably, functionally equal Hall switch elements 20-1, 20-2, 20-3 are connected in series, wherein the output terminal of the previous Hall switch element is connected to the respective input terminal of the subsequent Hall switch element.

With regard to the present invention, it should further be noted that the Hall switch elements can, for example, also have several Hall sensor elements, in order to detect, for example, various information, such as motion or rotation direction and motion or rotation speed and distance or position of an object, respectively. Such Hall switch elements can then also have, for example, a plurality of parallel input terminals and corresponding output terminals to transfer various information in parallel from Hall switch element to Hall switch element, such as rotation direction and rotation speed of an object at the same time. The information accumulated on the different paths is then provided to the corresponding input terminals of the microprocessor means 50. This embodiment is to be seen as merely optional.

For simplifying the description of the inventive concept of a Hall switch arrangement of a plurality of Hall switch elements connected in series, the inventive concept is explained with regard to Hall switch elements with one input terminal and one output terminal.

According to the present invention, the first Hall switch element 20-1 generates the first output signal $OUT_1$ at its output terminal, preferably in cyclic intervals. The mode of operation of the Hall switch arrangement 100 illustrated in FIG. 2 is explained with regard to a data log via a so called bi-phase coding, wherein it should become obvious with regard to the present invention that any suitable data logs with respective signal codings can be used for the inventive concept of a Hall switch arrangement with a plurality of Hall switch elements connected in series. The data log merely has to be able to transfer either individual logic signal levels and signal values, respectively, a bit sequence or a coded signal between the individual Hall switch elements as output and input signals, respectively, wherein the output signals of the individual Hall switch elements contain switching state information of all previous Hall switch elements and the current Hall switch element.

As illustrated in FIG. 2, the first Hall switch element 20-1 is wired such that the input terminal 20-1d is connected to a reference potential, e.g. ground potential GND. The Hall switch element 20-1 can, however, also be embodied without the input terminal 20-1d, wherein it is merely important that the Hall switch element 20-1 realizes its special position as start component, i.e. start Hall switch element. Further, it should be noted that the first Hall switch element 20-1 can also be embodied without the memory element 28, which is associated to the evaluation and processing means 26, since the first Hall switch element 20-1 does not have to latch an input signal from a previous Hall switch element.

According to the used data log, it applies for a possible power-up behavior of the Hall switch arrangement 100 that the output terminals of the individual Hall switch elements 20-1, 20-2 and 20-3 are on a first logic level, e.g. on a low logic level, for a predetermined time period, so that the start component, i.e. the first Hall switch element 20-1 realizes its special position. Therefore, the input terminal of the first Hall switch element is connected, for example, to a reference potential, e.g. ground potential or another potential (≠high logic level). Starting from the idle state, where a first logic level is applied to the data line, the first semiconductor device 20-1 starts a data log in cyclic time periods, for example with a double-length start pulse SP, wherein the length of the start pulse is related, for example, to the clock period of a system clock signal.

The cyclic time interval, with which the data log is started by the first Hall switch element 20-1 depends, for example, on the number of cascaded Hall switch elements, the used data log, the microprocessor utilization and other environmental variables to be considered. The Hall switch element 20-1 attaches its status information $INFO_1$ to the double-length start pulse SP, wherein the status information $INFO_1$ is, for example, coded with a bi-phase coding and represent the respective switching state of the first Hall switch element 20-1. As illustrated in FIG. 3 with regard to the output signal $OUT_1$ of the first Hall switch element 20-1, the status information $INFO_1$ has two bits, wherein the first bit has a low logic level and the second bit a high logic level. By the transition from a low logic level to a high logic level in the status information $INFO_1$, i.e. by the direction of the signal change, the switching state of the first Hall switch element 20-1 is defined. In the present case, for example the transition from a low logic level to a high logic level indicates a first switching state "1", wherein correspondingly the transition from a high logic level to a low logic level indicates a second switching state "0".

The status information $INFO_1$ of the first Hall switch element 20-1 ends with a so called status information end SE, which is signalized, for example, by a logic low state with double length as log end for the first Hall switch element 20-1. The resulting data word $DW_1$ of the first Hall switch element 20-1 consisting of the log start pulse SP, the status information $INFO_1$ and the log end SE is now provided by the output terminal 20-1c of the first Hall switch element 20-1 at the input terminal 20-2d of the subsequent Hall switch element 20-2, i.e. the data word is transferred to the next Hall switch element 20-2.

This first data word $DW_1$ is now latched by the second Hall switch element 20-2, preferably in the memory element 28 designed as latch. The second Hall switch element 20-2 detects the data word $DW_1$ with the double-length start pulse SP, the status information $INFO_1$ of the first switch element 20-1 and the status information end SE. The second switch element 20-2 and the evaluation and processing means 26 of the second switch element 20-2, respectively, attaches now its own status information $INFO_2$ with regard to its switching state to the status information $INFO_1$ of the first Hall switch element 20-1 and inserts the same into the data word, respectively, and attaches again a status information end pulse SE to obtain the further data word $DW_2$ which contains the status information with regard to the first and second Hall switch element 20-1 and 20-2.

This process of adding status information to the respective data word is performed with regard to the number of Hall switch elements connected in series, wherein the last Hall switch element, i.e. the Hall switch element 20-3 in FIG. 2 provides the resulting data word $DW_3$ with all status information with regard to the Hall switch elements 20-1, 20-2, 20-3 connected in series at the input terminal 50a of microprocessor 50, wherein the microprocessor 50 is formed to evaluate the output signal of the last Hall switch element, i.e. the finally present data word $DW_3$, and to recover the status information and switching state information, respectively, with regard to the individual Hall switch elements.

The inventive concept of a Hall switch arrangement with a plurality of Hall switch elements connected in series can thus be summarized such that the used Hall switch elements have an additional input, wherein in the Hall switch elements connected in series the input of the terminal of a Hall switch element is connected to the output terminal of a previous Hall switch element. The output of the last Hall switch element in a chain is now preferably connected to a single input terminal of a microprocessor means. The first Hall switch element starts a signal and data log, respectively, and transfers, for example, a data word with the status information with regard to the switching state of the first Hall switch element to the subsequent Hall switch element, which again introduces and attaches, respectively, its own status information about the switching state into the present data word and transfers the now present data word to the Hall switch element and the microprocessor, respectively.

Thus, according to the invention, it is achieved that only one line and one microprocessor input are required to transfer the status information, i.e. the switching state information of every Hall switch element in the cascade to the microprocessor means.

According to the present inventive Hall switch arrangement 100, it should be noted that the maximum number of Hall switch elements connectable in series is substantially determined by the repetition rate of the data output and by the size of the internal latching elements of the individual Hall switch elements, wherein, in practice, the number is selected to ensure a sufficient time resolution of the detection and evaluation of the desired measurement values (switching states) of the individual Hall switch elements.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A Hall switch arrangement with a plurality of Hall switch elements connected in series, comprising:
   a first Hall switch element, wherein the first Hall switch element is formed to provide a first output signal having information about a switching state of the first Hall switch element, and
   a second Hall switch element, wherein the second Hall switch element is formed to receive the first output signal of the first Hall switch element and to provide a further output signal having information about the switching state of the first Hall switch element and further information about a switching state of the second Hall switch element.

2. The Hall switch arrangement according to claim 1, wherein the switching state of the first Hall switch element is based on a magnetic field component penetrating the first Hall switch element.

3. The Hall switch arrangement according to claim 1, wherein the switching state of the second Hall switch element is based on a magnetic field component penetrating the second Hall switch element.

4. The Hall switch element according to claim 1, wherein the first Hall switch element provides the first output signal in cyclic intervals.

5. The Hall switch arrangement according to claim 1, wherein the second Hall switch element provides the second output signal in response to the first output signal of the previous first Hall switch element.

6. The Hall switch arrangement according to claim 1, wherein the Hall switch arrangement has a further Hall switch element or a plurality of further Hall switch elements.

7. The Hall switch arrangement according to claim 6, wherein the output signal of every further Hall switch element has the switching state information of the respectively previous Hall switch elements and the current Hall switch element.

8. The Hall switch arrangement according to claim 1, wherein the last Hall switch element of the Hall switch elements connected in series is connected to an input terminal of a microprocessor on the output side.

9. The Hall switch arrangement according to claim 8, wherein the plurality of Hall switch elements is formed to transfer accumulated switching state information from one Hall switch element to the respectively subsequent Hall switch element up to the microprocessor.

10. The Hall switch arrangement according to claim 9, wherein the status information is present as signal level, as logic signal values, as bit sequence, as coded signal and/or as data word.

11. The Hall switch arrangement according to claim 8, wherein the microprocessor is formed to evaluate the last output signal of the last Hall switch element in the cascade and to recover the information about the switching states of the Hall switch elements.

12. The Hall switch arrangement according to claim 1, wherein the Hall switch elements comprise:
a first reference potential terminal;
a second reference potential terminal;
a Hall element for outputting a Hall signal in dependence on the magnetic field component penetrating the Hall element;
an output terminal for providing an output signal to the subsequent Hall switch element or the microprocessor; and
an evacuator and processor for evaluating and processing the Hall signal and for providing the output signal at the output terminal.

13. The Hall switch arrangement according to claim 12, wherein the second Hall switch element or every further Hall switch element further comprises:
an input terminal for receiving the output signal of the previous Hall switch element; and
an evaluator and processor for evaluating the output signal of the previous Hall switch element.

14. The Hall switch arrangement according to claim 13, wherein further a latch for latching the output signal of the previous Hall switch element is associated to the evaluator and processor.

15. A Hall switch arrangement with a plurality of Hall switch elements connected in series, comprising:
a first Hall switch element providing a first output signal including information about a switching state of the first Hall switch element, and a second Hall switch element receiving the first output signal of the first Hall switch element and providing a further output signal having information about the switching state of the first Hall switch element and further information about a switching state of the second Hall switch element.

16. The Hall switch element according to claim 15, wherein the first Hall switch element provides the first output signal in cyclic intervals.

17. The Hall switch arrangement according to claim 15, wherein the second Hall switch element provides the second output signal in response to the first output signal of the previous first Hall switch element.

18. The Hall switch arrangement according to claim 15, wherein the Hall switch arrangement has a further Hall switch element or a plurality of further Hall switch elements, and wherein the output signal of every further Hall switch element has the switching state information of the respectively previous Hall switch elements and the current Hall switch element.

19. The Hall switch arrangement according to claim 15, wherein the last Hall switch element of the Hall switch elements connected in series is connected to an input terminal of a microprocessor on the output side, and wherein the plurality of Hall switch elements is formed to transfer accumulated switching state information from one Hall switch element to the respectively subsequent Hall switch element up to the microprocessor, and wherein the status information is present as signal level, as logic signal values, as bit sequence, as coded signal and/or as data word.

20. A Hall switch arrangement with a plurality of Hall switch elements connected in series, comprising:
a first Hall switch element providing a first output signal including information about a switching state of the first Hall switch element, and a second Hall switch element receiving the first output signal of the first Hall switch element and providing a further output signal having information about the switching state of the first Hall switch element and further information about a switching state of the second Hall switch element, wherein the switching state of the first Hall switch element is based on a magnetic field component penetrating the first Hall switch element, and wherein each Hall switch elements comprises:
a first reference potential terminal;
a second reference potential terminal;
a Hall element for outputting a Hall signal in dependence on the magnetic field component penetrating the Hall element;
an output terminal for providing an output signal to the subsequent Hall switch element or the microprocessor; and
an evaluator and processor for evaluating and processing the Hall signal and for providing the output signal at the output terminal.

* * * * *